(12) United States Patent
Jacob et al.

(10) Patent No.: US 6,731,554 B1
(45) Date of Patent: May 4, 2004

(54) 2T2C SIGNAL MARGIN TEST MODE USING RESISTIVE ELEMENT

(75) Inventors: Michael Jacob, Kanagawa-ken (JP); Joerg Wohlfahrt, Kanagawa-ken (JP); Thomas Roehr, Kanagawa-ken (JP); Nobert Rehm, Kanagawa-ken (JP)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/301,546

(22) Filed: Nov. 20, 2002

(51) Int. Cl.$^7$ .............................................. G11C 29/00
(52) U.S. Cl. ..................... 365/201; 365/145; 365/149
(58) Field of Search ................................. 365/201, 145, 365/149

(56) References Cited

U.S. PATENT DOCUMENTS

| | | | | |
|---|---|---|---|---|
| 6,229,728 | B1 * | 5/2001 | Ono et al. .................... | 365/145 |
| 6,522,567 | B2 * | 2/2003 | Iwanari ....................... | 365/145 |
| 2002/0093847 | A1 * | 7/2002 | Tada ........................... | 365/145 |
| 2003/0185041 | A1 * | 10/2003 | Takahashi et al. .......... | 365/145 |

* cited by examiner

*Primary Examiner*—Son Mai
(74) *Attorney, Agent, or Firm*—Fish & Richardson P.C.

(57) ABSTRACT

The present invention provides a test mode section for facilitating a worst case product test sequence for signal margin to ensure full product functionality over the entire component lifetime taking all aging effects into account. A semiconductor memory test mode configuration includes a first capacitor for storing digital data connecting a cell plate line to a first bit line through a first select transistor. The first select transistor is activated through a connection to a word line. A second capacitor stores digital data and connects the cell plate line to a second bit line through a second select transistor. The second select transistor is activated through a connection to the word line. A sense amplifier is connected to the first and second bit lines for measuring a differential read signal on the first and second bit lines A resistor is connected to one or both of the bit lines through transistors for adding or reducing the amount of charge on the first bit line when the third transistor is turned on to reduce the differential read signal.

16 Claims, 4 Drawing Sheets

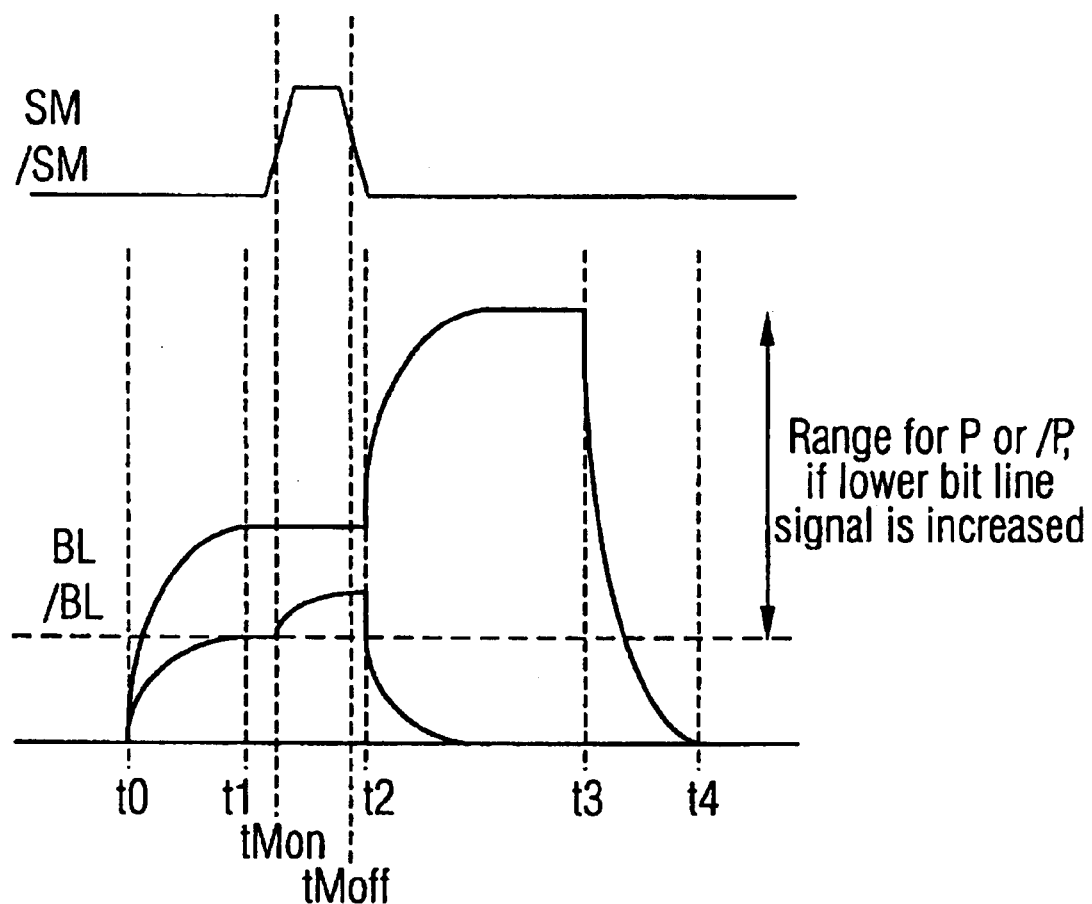

2T2C SIGNAL MARGIN TEST MODE USING RESISTIVE ELEMENT

RELATED APPLICATIONS

The present disclosure is related to the following concurrently filed applications, all of which are to be assigned to Infineon Technologies AG and all of which are hereby Incorporated by reference in their entirety into the present disclosure:

"2T2C Signal Margin Test Mode Using Different Pre-Charge Levels for BL and /BL" to Michael Jacob et al., Ser. No. 10/301,547; "2T2C Signal Margin Test Mode Using a Defined Charge and Discharge of BL and/BL" to Hans-Oliver Joachim et al., Ser. No. 10/301,548; and "2T2C Signal Margin Test Mode Using a Defined Charge and Discharge of BL and /BL" to Hans-Oliver Joachim et al., Ser. No. 10/301,529.

FIELD OF THE INVENTION

The present invention relates to the implementation of circuits for testing signal margin in memory cells operating in a 2T2C configuration.

BACKGROUND OF THE INVENTION

In semiconductor memories, reliability issues have become more complicated with increasing memory sizes, smaller feature sizes and lower operating voltages. It has become more Important to understand the cell signal sensing operation, the signal of memory cells and the limiting factors. One particularly important characteristic in reliability determinations of semiconductor memories is the signal margin. In a 2T2C memory cell configuration, the signal margin is a measure of the zero-versus-one signal measured by the sense amplifier. It is particularly useful to be able to measure the signal margin at product level. The results of product-level signal-margin tests can be used to optimize reliability and as well as the sense amplifier design and the bit line architecture to optimize dynamic memory cell readout. Moreover, a product level test sequence for signal margin can help ensure full product functionality over the entire component lifetime taking all aging effects into account.

Among the more recent semiconductor memories, Ferroelectric Random Access Memories (FeRAMs) have attracted much attention due to their low-voltage and high-speed operation In addition to their non-volatility. FIG. 1 shows a typical prior art FeRAM memory cell in a 2T2C configuration. The 2T2C configuration utilizes two transistors and two capacitors per bit. The 2T2C configuration is beneficial because it allows for noise cancellation between the transistors. Two storage capacitors (Cferro) are connected to a common plate line (PL) on one side and to a pair of bit lines (BL, /BL) on the other side via two select transistors (TS). The two transistors are selected simultaneously by a common word line (WL). A dedicated bit line capacitance (CBL) is connected to each bit line. This bit line capacitance is required for the read operation of the memory cell. The differential read signal on the bit line pair is evaluated in a connected sense amplifier. The polarization is always maintained in directly opposed states in the two storage capacitors of one 2T2C memory configuration.

The signals on the bit lines during a read access are shown in FIG. 4. FIGS. 4–7 of the present disclosure all include a plot of the read signals on BL /BL vs. time. In these plots, one of the lines represents the read signal on BL and one represents the read signal on /BL. Which signal is represented by which of the lines depends on whether the read signal on BL or the read signal on /BL is larger Both bit lines BL and /BL are pre-charged to the same level (e.g. 0V in the figure). Also, shortly before t0, the word line WL is activated (here "active" means WL is high for conventional FeRAMs and low for chain FeRAMs). The word line WL is not deactivated until shortly after write-back is finished. At time t0 the plate is activated and a read signal appears on the bit lines according to the capacitance ratio $C_{ferro}/C_{BL}$. The effective capacitance of a ferroelectric capacitor depends on its polarization state prior to the read operation. At time t1 the full read signals are developed on the two bit lines. At t2 the sense amplifier is activated and the bit line signals are boosted to the full bit line voltages. At t3 the sense amplifier is deactivated and the access cycle ends at t4.

A good solution for determining signal margin in FeRAM memory cells utilizing a single transistor and capacitor (1T1C) is to sweep the reference bit line voltage. A prior art method for determining signal margin in 2T2C FeRAM memory cells is to shift the bit line level by capacitor coupling. However, this method is unsatisfactory because it requires an additional capacitor.

It would therefore be desirable to provide a circuit with a test mode section for facilitating a worst case product test sequence for signal margin. It would also be desirable to design such a circuit for use with semiconductor memories in a 2T2C configuration without requiring additional capacitors in the circuit.

SUMMARY OF THE INVENTION

The present invention provides a test mode section for facilitating a worst case product test sequence for signal margin to ensure full product functionality over the entire component lifetime taking all aging effects into account. The invention works well with semiconductor memories having a 2T2C configuration.

A first aspect of the present invention proposes in general terms a semiconductor memory test mode configuration, comprising a first capacitor for storing digital data connecting a cell plate line to a first bit line through a first select transistor, the first select transistor activated through a connection to a word line; a second capacitor for storing digital data connecting the cell plate line to a second bit line through a second select transistor, the second select transistor activated through a connection to the word line; a sense amplifier connected to the first and second bit lines for measuring a differential read signal on the first and second bit lines; and a resistor connected to the first bit line through a third transistor for changing the amount of charge on the first bit line when the third transistor is turned on to reduce the differential read signal.

Another aspect of the present invention includes a method for testing a semiconductor memory comprising the steps of: activating a cell plate line to produce a read signal on first and second bit lines representing digital data stored by a pair of capacitors connected to the cell plate line through first and second transistors; activating a third transistor connected to the first bit line for a time interval to change the amount of charge on the first bit line by moving charge through a resistor connected through the third transistor to the bit line; activating a sense amplifier connected to the first and second bit lines thereby boosting read signals on the first and second bit lines; and determining a reduced differential read signal on the first and second bit lines due to the changed amount of charge on the first bit line. The method also includes writing write data to the memory, reading read data from the memory, comparing the read data to the written data; and determining the signal margin of the cell when the amount of charge moved through the third transistor is an amount causing a failure of the comparison of the read data with the written data.

BRIEF DESCRIPTION OF THE FIGURES

Further preferred features of the invention will now be described for the sake of example only with reference to the following figures, in which:

FIG. 7 plots the signals on the bit lines along with the signal SM or /SM during a read access cycle for the circuit of FIG. 3 for the case when the potential P or /P is higher than the lower original bit line voltage level.

DETAILED DESCRIPTION OF THE EMBODIMENTS

Figure 1:
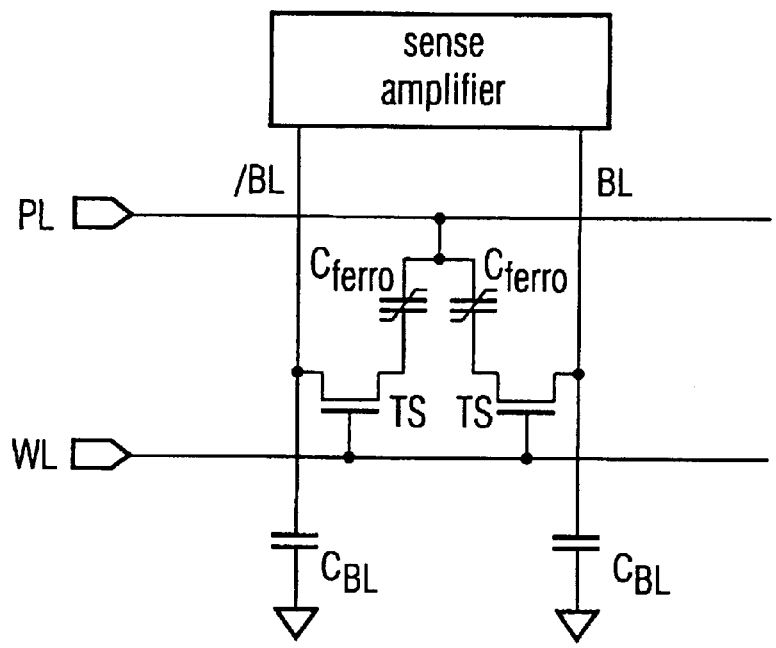
FIG. 1 illustrates a 2T2C memory configuration of the prior art.
Figure 2:
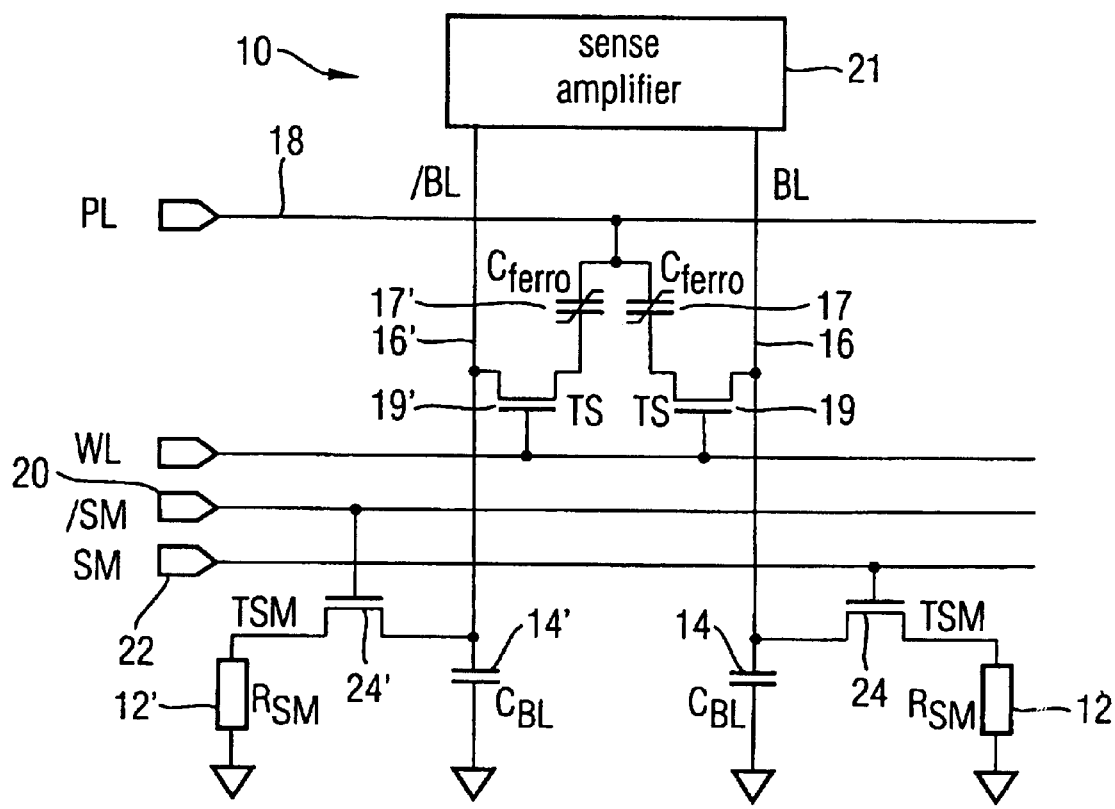
FIG. 2 shows a memory configuration of the present invention having additional resistors connected In parallel with the bit line capacitors and grounded at one end.

FIG. 2 shows a circuit schematic of a memory cell 10 according to the invention. Additional resistors (RSM) 12, 12' are connected in parallel to bit line capacitances 14, 14', respectively. The resistors (RSM) 12, 12' are separately switchable for bit lines BL 16 and /BL 16' by separate signals SM 22 or /SM 20 on transistors TSM 24, 24'. In another embodiment, both of the signal inputs SM 22 and /SM 20 are activated in parallel. The signal inputs SM 22, /SM 20 are kept at non-active (wherein the transistor TSM 24 or 24' is off) during normal operation and the circuit is electrically similar to the circuit shown in FIG. 1. During testing, one of the signal inputs (or, in another embodiment, both of the signal inputs) SM 22 or /SM 20 can be activated thereby opening a controlled "leakage path" for the bit line charge via the resistor (RSM) 12 or 12' to ground, thus decreasing the read voltage on the respective bit line. The higher signal, which can be on either BL 16 or /BL 16', is therefore reduced and the difference between the higher and lower bit line signals becomes smaller for this test. The amount of "signal margin" can be controlled by the time window during which the transistor TSM 24 is switched on, i.e. between tMon and tMoff.

In order to test the memory cell of FIG. 2, data is first written into the memory cell and afterwards the data is read and compared to the expected (i.e. written ) data. Thus, during testing It is known which line, BL 16 or /BL 16', should have a lower and which should have a higher signal. 2T2C signal margin can be tested by selectively reducing the difference between a "0" signal on one bit line and a "1" signal on the other bit line.

Figure 5:
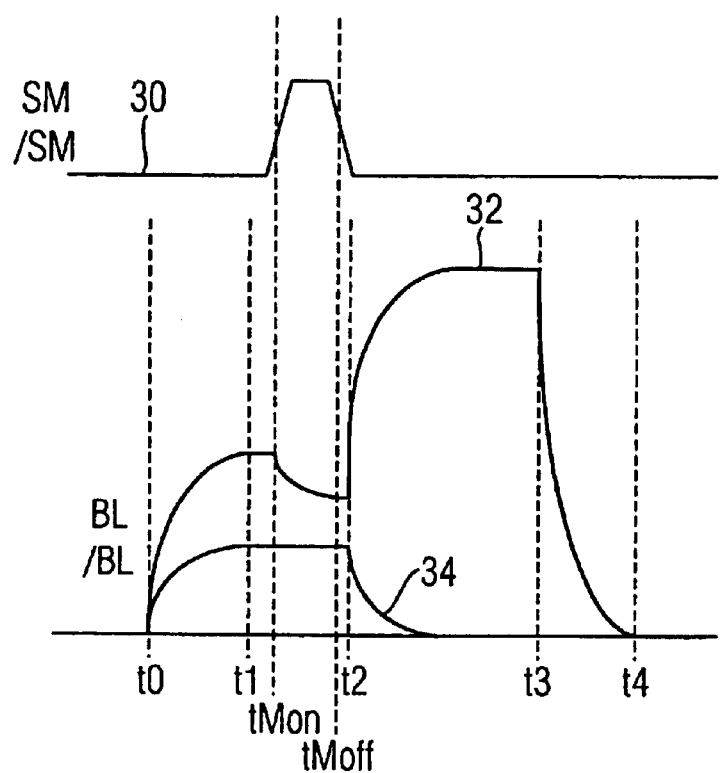
FIG. 5 plots the signals on the bit lines along with the signal SM or /SM during a read access cycle for the circuit of FIG. 2.

The corresponding bit-line 16, 16' signals are shown in FIG. 5. The trace 30 represents the signals SM 22 or /SM 20 for activating the transistors TSM 24 or 24'. The traces 32 and 34 represent the signal levels on the bit lines BL 16 and /BL 16'. First, the bit lines BL 16 and /BL 16' are pre-charged to a certain level (e.g. 0V in the figure). At time t0 a common plate line (PL) 18 is activated and a read signal appears on the bit lines according to the capacitance ratio Cferro/CBL. Here, Cferro is the capacitance of storage capacitors Cferro 17 and Cferro 17' which are connected to the plate 18 on one side and to the pair of bit lines (BL 16, /BL 16') on the other side via two select transistors (TS) 19, 19'. CBL is the capacitance of dedicated bit line capacitances (CBL) 14, 14' connected to each bit line. At time t1 again the full read signals are developed on the two bit lines 16, 16'. At time tMon, the signal SM 22 is activated if the bit line 16' is expected to have the higher signal, or the signal /SM 20 is activated if the bit line 16 is expected to have the higher signal. Activating the signal SM 22 switches on the transistor TSM 24 while activating the signal /SM 20 switches on the transistor TSM 24'. At time tMoff, the signal SM 22 or /SM 20 is deactivated again, once again turning off transistors TSM 24 or TSM 24', respectively. There is no limitation for tMon and tMoff in this invention. In one preferred embodiment, the signal SM 22 is activated at a time tMon concurrent is with or after the time t1 at which the signals are developed on the bit lines (tMon t1). Before or concurrently with the time t2 at which a sense amplifier 21 is turned on, de-charging of the bit lines is finished and the signal SM 22 is deactivated (tMoff t2). In other embodiments, tMon can occur before t1 in order to help save access time. Also tMoff can occur after t2.

The charge on the bit line with the higher read signal is decreased by draining off charge through the resistors (RSM) 12 or 12', resulting in a decreased signal on this bit line at t2 when the sense amplifier 21 is activated and the bit line signals are boosted to the full bit line voltages. As a result, the differential read signal, i.e. the difference between the two bit-line signals, is decreased accordingly, which tightens the margin for a save operation of the chip (the worst case test condition). At t3 the sense amplifier is deactivated and the access cycle ends at t4 The signal margin can be determined by varying the time window during which the transistor TSM 24 is switched on, i.e. between tMon and tMoff. For different time windows data is written to and read from the memory cell 10. The actual signal margin is determined from the point wherein the time window becomes narrow enough so that the signal read changes from pass to fail.

One example of the procedure to test for the analog value of the signal margin is illustrated by the following steps:

1. Write data to and then read data from the memory cell in normal operation (without activating the transistors TSM 24 or 24'). If the differential read signal is too small, then a comparison of the read data with the write data fails, thereby indicating that the circuit has no signal margin. If the differential read signal is sufficiently large then step 2 is performed.

2. Write data to and then read data from the memory cell with the time window of the transistors 24 or 24' set to a small value signal margin (SM0) to drain some of the charge from the bit lines. If the differential read signal is too small, then a comparison of the read data with the write data fails, thereby indicating that the circuit has no signal margin. If the differential read signal is sufficiently large then step 3 is performed.

3. Write data to and then read data from the memory cell with the is time window of the transistors 24 or 24' set to a slightly larger value corresponding to first signal margin (SM1) to drain some of the charge from the bit lines. If the differential read signal is too small, then a comparison of the read data with the write data fails, thereby indicating that the circuit has a signal margin corresponding to SM0. If the differential read signal is sufficiently large then step 4 is performed.

4. Write data to and then read data from the memory cell with the time window of the transistors 24 or 24' set to an even larger value corresponding to second signal margin (SM2) to drain more of the charge from the bit lines. If the differential read signal is too small, then a comparison of the read data with the write data fails, thereby indicating that the circuit has a signal margin corresponding to SM1. If the differential read signal is sufficiently large then the test is continued until the failure of the comparison.

In another embodiment, the above procedure is performed by increasing the charge on the bit line having the lower bit line voltage level rather than, or in addition to, decreasing the charge on the bit line having the higher bit line voltage level.

In another embodiment of the invention, each of the additional resistors (RSM) 12 or 12' can be divided into more than one part, in order to realize a variety of signal margin steps. Thus rather than changing the time window (TMon-Tmoff), the amount of charge discharged from the bit lines can be varied by changing the value of resistance attached to the transistors TSM 24 or 24'. Alternatively, a combination of changing the time window and resistances can be used to vary the amount the bit lines are discharged.

Figure 3:
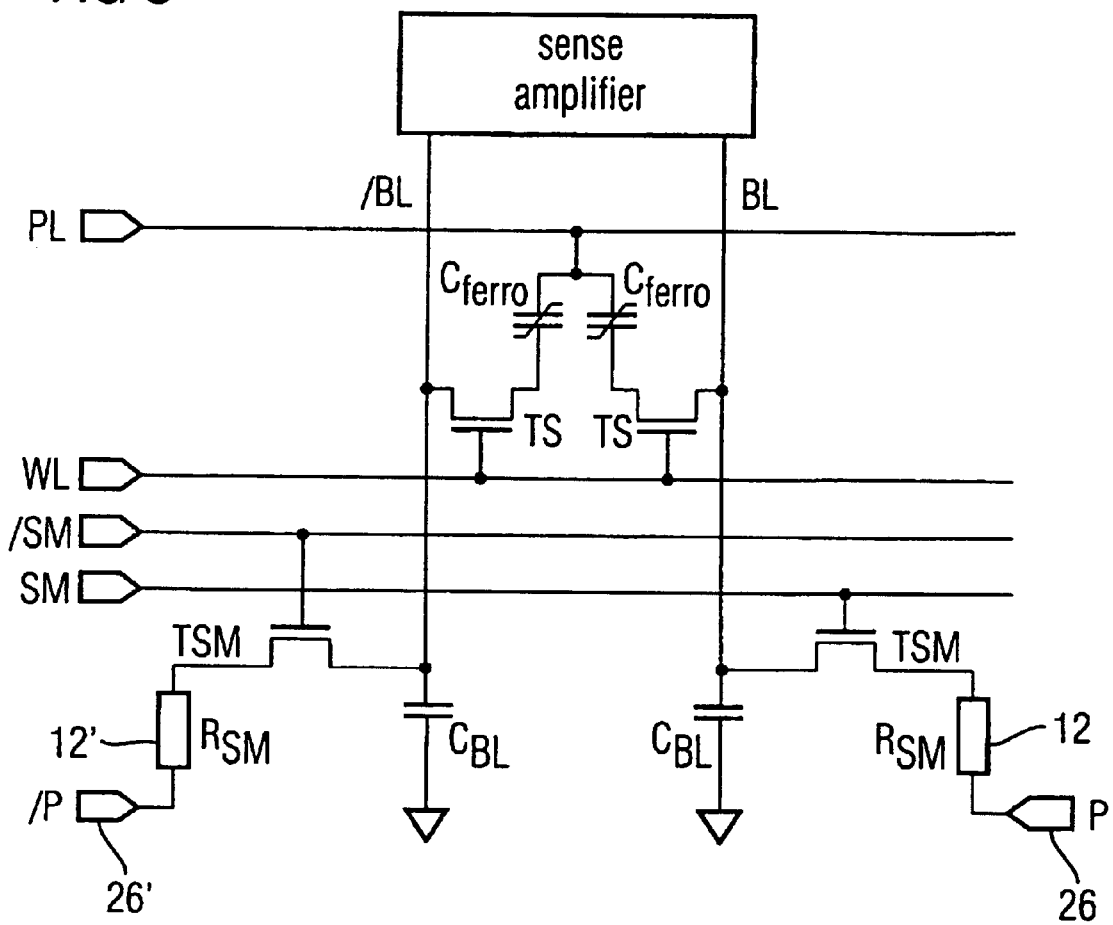
FIG. 3 illustrates another embodiment of the memory configuration of the present invention having additional resistors connected in parallel with the bit line capacitors and coupled to voltage potentials at one end.
Figure 4:
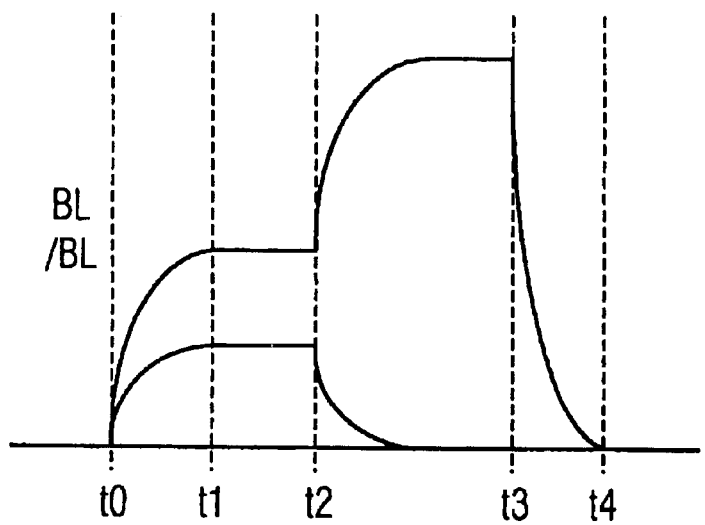
FIG. 4 plots the signals on the bit lines during a read access cycle In the prior art circuit of FIG. 1.
Figure 6:
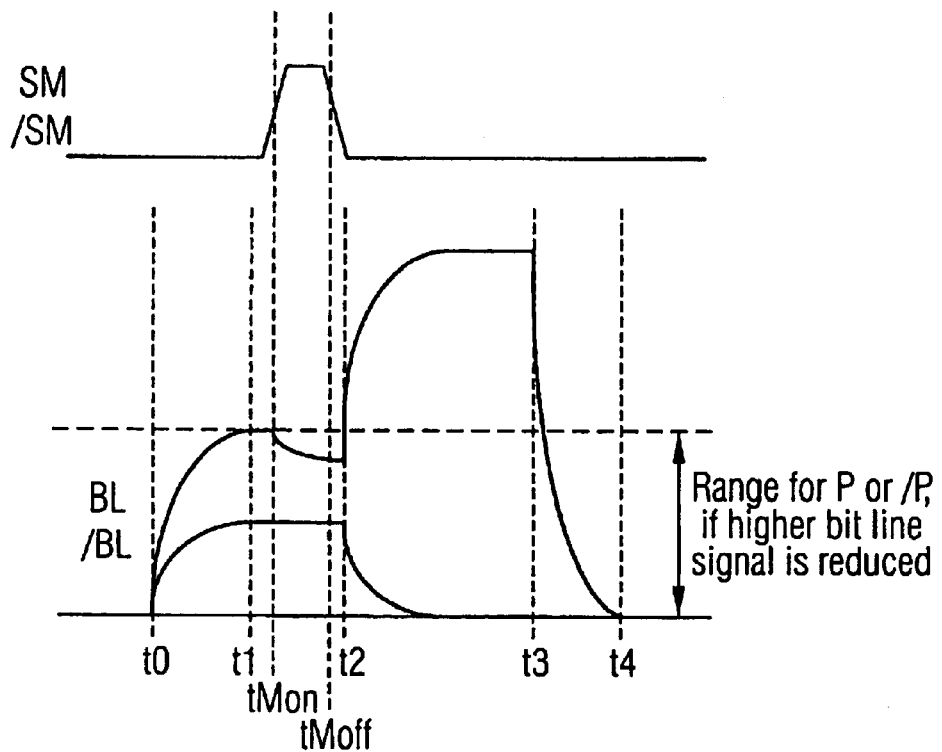
FIG. 6 plots the signals on the bit lines along with the signal SM or /SM during a read access cycle for the circuit of FIG. 3 for the case when the potential P or /P is in the range between ground and the higher original bit line voltage level.

The embodiment illustrated in FIG. 3 is similar to that of FIG. 2, except that the resistors (RSM) 12 and 12' are not coupled to ground, but rather to the potentials P 26, /P 26', respectively. The potentials P 26 and /P 26' can be static or pulsed. The circuit of this embodiment gives more freedom to chose the signal margin. Thus, in addition to changing the time window and changing the resistances 12, 12', the charge on the bit lines 16, 16' can be changed by using different potentials P 26 and/or /P 26' in the above described procedure to test for the analog value of the signal margin FIG. 6 illustrates the situation wherein the potential P or /P is in the range between ground and the higher original bit line voltage level, and it is connected (via RSM and TSM) to the bit line with the higher voltage. The potential P 26 or /P 26' is thus used to decrease the higher bit line voltage level. The magnitude of the bit line voltage decrease depends on the potential P 26 or /P 26'. FIG. 7 illustrates the situation wherein the potential P 26 or /P 26' is higher than the lower original bit line voltage, and It is connected (via RSM and TSM) to the bit line with the lower voltage. The potential P 26 or /P 26' is thus used to increase the lower bit line voltage level. The magnitude of the bit line voltage decrease depends on the potential P 26 or /P 26'.

In all of the above embodiments the described components, including the resistors (RSM) 12 and 12' and the transistors TSM 24, 24', can be formed on the same die. Also, the term "connected" as used in the present disclosure does not imply that connected components must be in direct physical contact. Rather, the components need only be electrically connected.

Thus, although the invention has been described above using particular embodiments, many variations are possible within the scope of the claims, as will be clear to a skilled reader.

We claim:

1. A semiconductor memory test mode configuration, comprising:
   a first capacitor for storing digital data connecting a cell plate line to a first bit line through a first select transistor, the first select transistor activated through a connection to a word line;
   a second capacitor for storing digital data connecting the cell plate line to a second bit line through a second select transistor, the second select transistor activated through a connection to the word line;
   a sense amplifier connected to the first and second bit lines for measuring a differential read signal on the first and second bit lines; and
   a third transistor for changing the amount of charge on the first bit line when the third transistor is turned on to reduce the differential read signal.

2. The semiconductor memory test mode configuration of claim 1, wherein the first bit line has a higher read signal than the second bit line and the charge on the first bit line is removed through a resistor connected through the third transistor to the first bit line to reduce the read signal on the first bit line.

3. The semiconductor memory test mode configuration of claim 1, wherein the first bit line has a lower read signal than the second bit line and the charge on the first bit line is added through a resistor connected through the third transistor to the first bit line to reduce the read signal on the first bit line.

4. The semiconductor memory test mode configuration of claim 1, further comprising a fourth transistor for changing the amount of charge on the second bit line when the fourth transistor is turned on to reduce the differential read signal.

5. The semiconductor memory test mode configuration of claim 1, wherein the third transistor is connect through a resistor to ground.

6. The semiconductor memory test mode configuration of claim 2, further comprising a voltage potential having a positive value lower than the read signal of the first bit line and connected to the first bit line through the resistor and the first transistor for removing charge on the first bit line.

7. The semiconductor memory test mode configuration of claim 3, further comprising a voltage potential having a value higher than the read signal of the first bit line and connected to the first bit line through the resistor and the first transistor for adding charge on the first bit line.

8. The semiconductor memory test mode configuration of claim 1, wherein a resistor is connected through the third transistor to the first bit line and the resistor is divided Into more than one part to realize a range of signal margin steps.

9. The semiconductor memory;test mode configuration of claim 1, wherein the first and second select transistors are Ferroelectric Random Access Memories.

10. The semiconductor memory test mode of claim 1, wherein the first and second capacitors are ferroelectric capacitors.

11. The semiconductor memory test mode of claim 1, further comprising a bit line capacitor connected between the third transistor and ground.

12. A method for testing a semiconductor memory comprising the steps of:
   pre-charging first and second bit lines;
   activating a cell plate line to produce a read signal on the first and second bit lines representing digital data stored by a pair of capacitors connected to the cell plate line through first and second transistors;
   activating a third transistor connected to the first bit line for a time interval to change the amount of charge on the first bit line by moving charge through a third transistor connected to the first bit line;

activating a sense amplifier connected to the first and second bit lines thereby boosting read signals on the first and second bit lines; and determining a reduced differential read signal on the first and second bit lines due to the changed amount of charge on the first bit line.

13. The method for testing a semiconductor memory of claim 12, further comprising the steps of:

writing write data to the memory;

reading read data from the memory;

comparing the read data to the written data; and determining the signal margin of the cell when the amount of charge moved through the third transistor is an amount causing a failure of the comparison of the read data with the written data.

14. The method for testing a semiconductor memory of claim 12, further comprising the step of activating a fourth transistor connected to the second bit line for a time interval to change the amount of charge on the second bit line by moving charge through an additional resistor connected through the fourth transistor to the second bit line.

15. The semiconductor memory test mode configuration of claim 12, wherein the first bit line has a higher read signal than the second bit line and the charge on the first bit line is removed through the resistor to reduce the read signal on the first bit line.

16. The semiconductor memory test mode configuration of claim 12, wherein the first bit line has a lower read signal than the second bit line and the charge on the first bit line is added through the resistor to increase the read signal on the first bit line.

* * * * *